United States Patent
Chiu et al.

(10) Patent No.: US 12,033,697 B2
(45) Date of Patent: Jul. 9, 2024

(54) MEMORY DEVICE AND OPERATING METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu (TW)

(72) Inventors: Yen-Cheng Chiu, Pingtung County (TW); Win-San Khwa, Taipei (TW); Meng-Fan Chang, Taichung (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 182 days.

(21) Appl. No.: 17/674,125

(22) Filed: Feb. 17, 2022

(65) Prior Publication Data

US 2023/0260575 A1    Aug. 17, 2023

(51) Int. Cl.
*G11C 13/00* (2006.01)

(52) U.S. Cl.
CPC ........ *G11C 13/004* (2013.01); *G11C 13/0004* (2013.01); *G11C 13/0038* (2013.01); *G11C 13/0069* (2013.01); *G11C 2013/0045* (2013.01); *G11C 2013/0054* (2013.01)

(58) Field of Classification Search
CPC .............. G11C 13/004; G11C 13/0004; G11C 13/0038; G11C 13/0069; G11C 2013/0045; G11C 2013/0054; G11C 2013/0092; G11C 2213/79; G11C 11/56; G11C 11/5678; G11C 13/0023; G11C 13/0064
USPC ........................................................ 365/148
See application file for complete search history.

(56) References Cited

U.S. PATENT DOCUMENTS

2020/0312396 A1* 10/2020 Pyo ..................... G11C 11/1673

FOREIGN PATENT DOCUMENTS

CN        105632558 B  *  1/2021  ......... G11C 11/1659

* cited by examiner

*Primary Examiner* — Hoai V Ho
(74) *Attorney, Agent, or Firm* — Birch, Stewart, Kolasch & Birch, LLP

(57) ABSTRACT

A memory device includes a current source and a memory array. The current source is configured to provide a current to a first node. The memory array is coupled to the current source at the first node. The memory array includes memory cells. First terminals of the memory cells are coupled to the first node. Each of the memory cells has a first resistance in response to having a first data value, and has a second resistance in response to having a second data value. The second data value is N times the first data value. The second resistance is approximately one-Nth of the first resistance, for N being a positive integer larger than one. A method of operating a memory device is also disclosed herein.

20 Claims, 11 Drawing Sheets

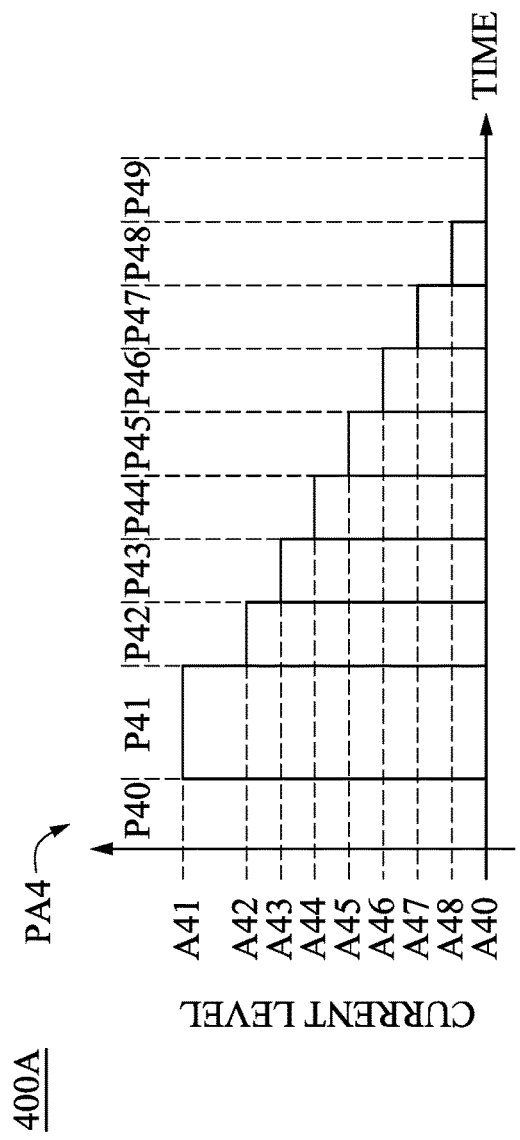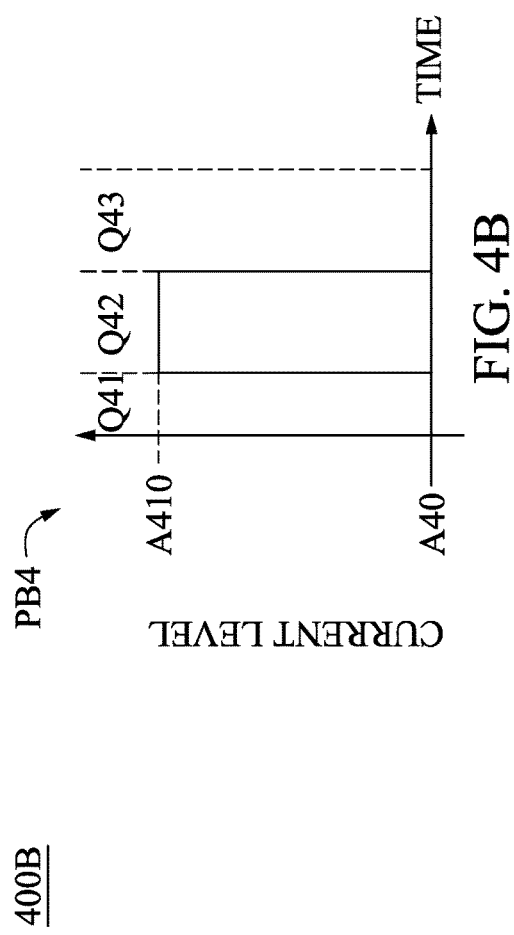

MEMORY DEVICE AND OPERATING METHOD THEREOF

BACKGROUND

A memory device includes memory cells for storing data. An in-memory computing is performed when the data is read from the memory cells. Each of the memory cells has multi-levels of data values. A resistance of each of the memory cells is associated with a data value of the data stored in the corresponding memory cell. Calculations are performed with the data value for the in-memory computing, such as multiply and accumulate (MAC) operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a timing diagram of a current pulse applied to the memory array shown in FIG. 2, in accordance with some embodiments of the present disclosure.

FIG. 4B is a timing diagram of a current pulse applied to the memory array shown in FIG. 2, in accordance with some embodiments of the present disclosure.

DETAILED DESCRIPTION

Figure 1:
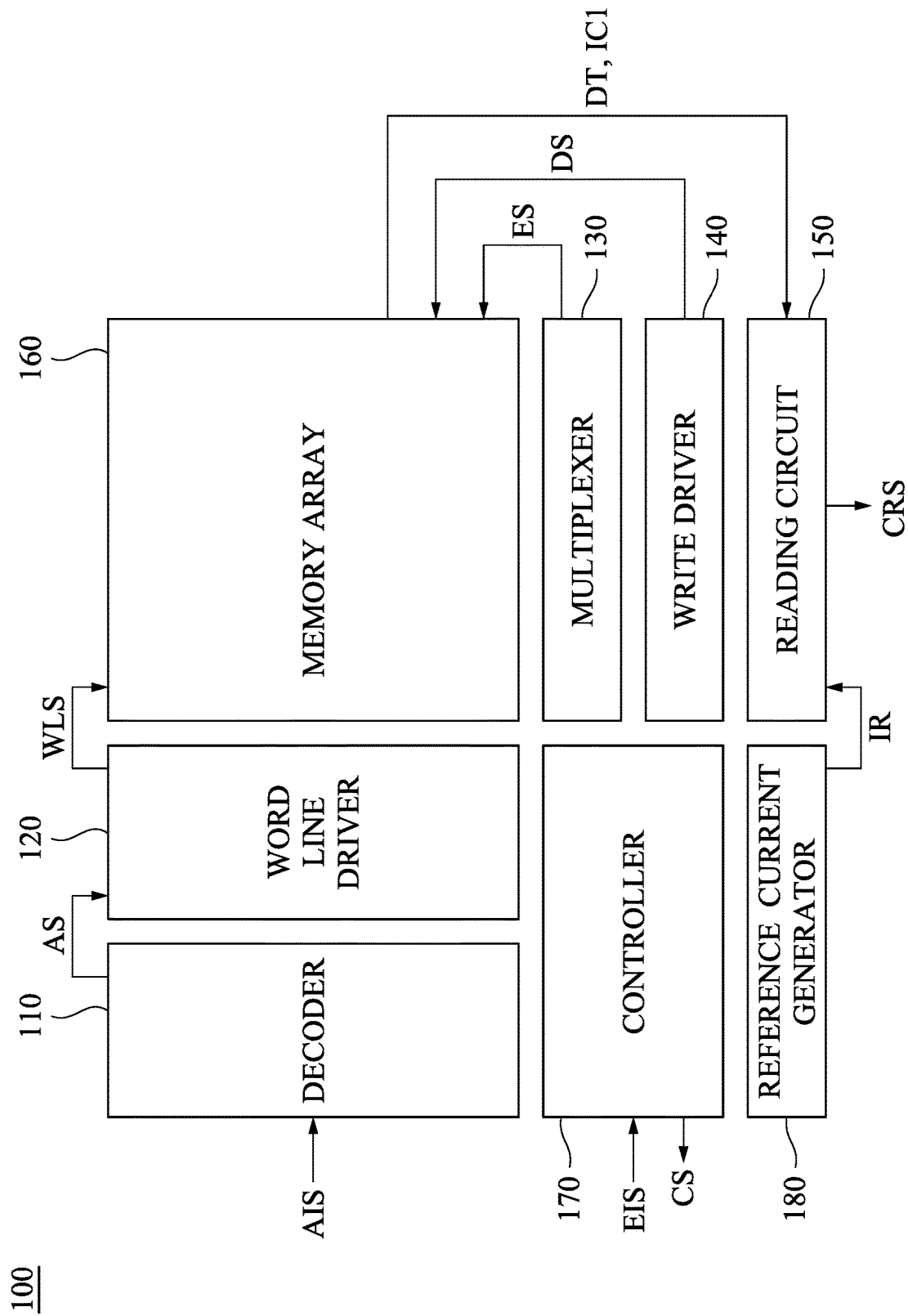
FIG. 1 is a schematic diagram of a memory device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a schematic diagram of a memory device 100 in accordance with some embodiments of the present disclosure. As illustratively shown in FIG. 1, the memory device 100 includes a decoder 110, a word line driver 120, a multiplexer 130, a write driver 140, a reading circuit 150, a memory array 160, a controller 170 and a reference current generator 180.

In some embodiments, the decoder 110 is configured to translate address input signals AIS into activation signals AS. In some embodiments, the address input signals AIS indicate some specific memory cells in the memory array 160. In some embodiments, the decoder 110 select and activate the specific memory cells in the memory array 160 according to the address input signals AIS.

In some embodiments, the word line driver 120 is configured to generate word line signals WLS according to the activation signals AS, to drive word lines of the memory array 160. In some embodiments, the word line driver 120 is configured to generate current pulses, such as current pulses PA4, PB4, P61-P63 and P81-P83 shown in FIG. 4A, FIG. 4B, FIG. 6 and FIG. 8, to adjust resistances of memory cells in the memory array 160.

In some embodiments, the multiplexer 130 is configured to generate enable signals ES to enable columns of the memory array 160. In some embodiments, the write driver 140 is configured to write data signal DS into the memory array 160. In some embodiments, the controller 170 is configured to translate external input signals EIS into control signals CS to control at least a part of the decoder 110, word line driver 120, the multiplexer 130, the write driver 140, the reading circuit 150, the memory array 160 and the reference current generator 180.

In some embodiments, the memory array 160 is configured to store data DT, and the reading circuit 150 is configured to read out the data DT from the memory array 160. In some embodiments, the memory array 160 is implemented as a phase change random access memory (PCRAM) and/or resistive random access memory (RRAM) including multilevel memory cells.

In some embodiments, the reading circuit 150 is further configured to compare cell currents IC1 from the memory array 160 and reference currents IR from the reference current generator 180 and generate a comparing result signal CRS. In some embodiments, the reference current generator 180 is configured to generate the reference currents IR for the reading circuit 150 performing the comparison. Further details associated with the reference currents IR and the comparing result signal CRS are described below with embodiments shown in FIG. 4A to FIG. 10. In some embodiments, the reading circuit 150 is implemented as a current sensing amplifier.

Figure 2:
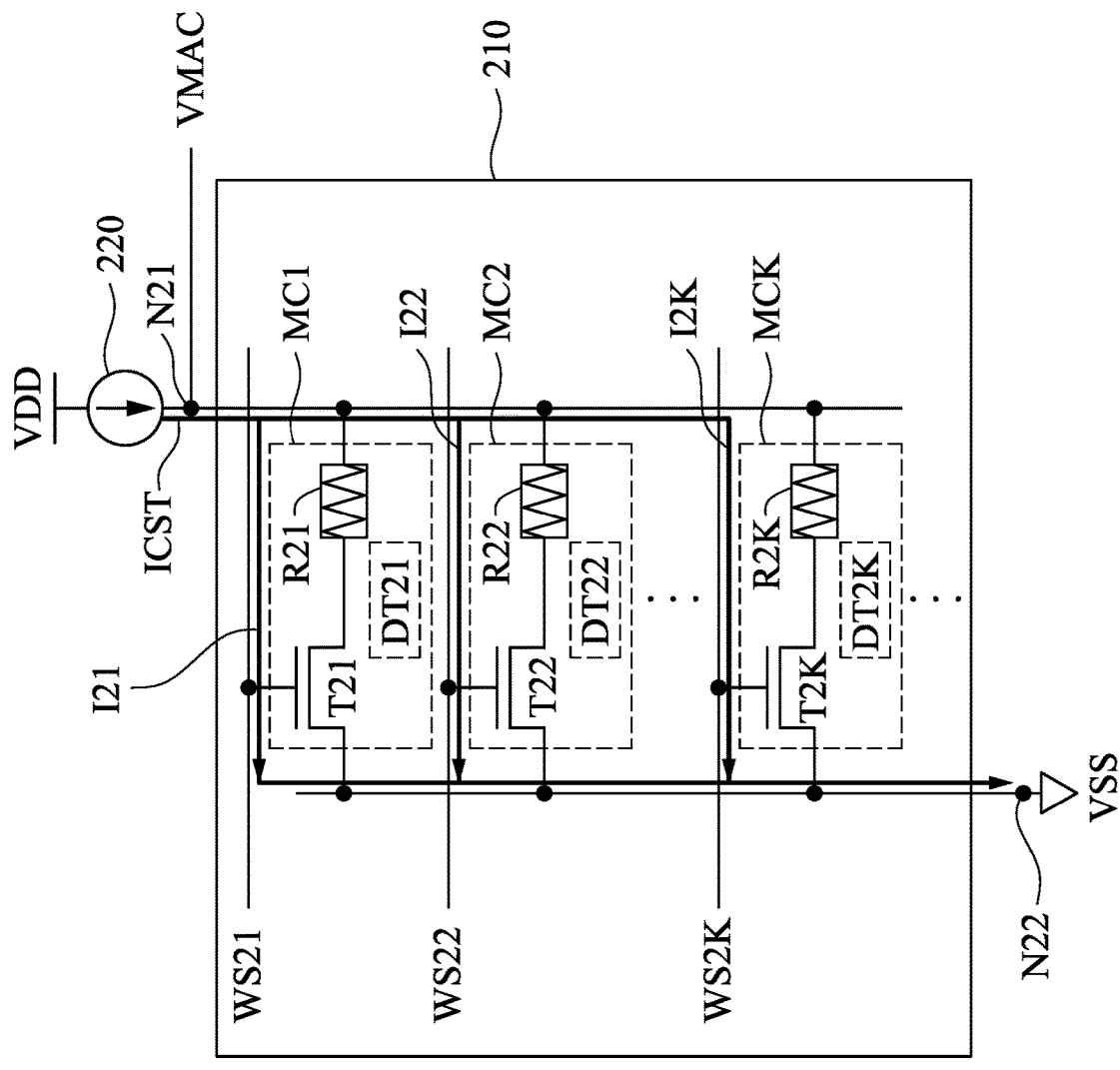
FIG. 2 is a schematic diagram of a memory device corresponding to the memory device shown in FIG. 1, in accordance with some embodiments of the present disclosure.

FIG. 2 is a schematic diagram of a memory device 200 corresponding to the memory array 160 shown in FIG. 1, in accordance with some embodiments of the present disclosure. As illustratively shown in FIG. 2, the memory device 200 includes a memory array 210 and a current source 220. In some embodiments, the memory array 210 and the current source 220 are configured to cooperate with each other to generate a voltage signal VMAC corresponding to data stored in the memory array 210 at a node N21.

As illustratively shown in FIG. 2, a terminal of the memory array 210 is coupled to the current source 220 at the node N21, and another terminal of the memory array 210 is configured to receive a reference voltage signal VSS at a node N22. A terminal of the current source 220 is coupled to the node N21, and another terminal of the current source 220 is configured to receive a reference voltage signal VDD. In some embodiments, a voltage level of the reference voltage signal VDD is higher than a voltage level of the reference voltage signal VSS.

For illustration of FIG. 2 with reference to FIG. 1, the memory array 210 is an embodiment of the memory array 160. For example, in some embodiments, the memory array 160 is coupled between the nodes N21 and N22, and is configured to generate the voltage signal VMAC corresponding to the data DT stored in the memory array 160.

In some embodiments, the memory array 210 includes memory cells MC1-MCK, for K being a positive integer. As illustratively shown in FIG. 2, first terminals of the memory cells MC1-MCK are coupled to the node N21, and second terminals of the memory cells MC1-MCK are coupled to the node N22. In some embodiments, the memory cells MC1-MCK are configured to store data DT21-DT2K, respectively.

In some embodiments, each of the memory cells MC1-MCK is configured to be activated by a corresponding word line signal. As illustratively shown in FIG. 2, the memory cells MC1, MC2 and MCK are configured to be activated by word line signals WS21, WS22 and WS2K, respectively. For illustration of FIG. 2 with reference to FIG. 1, the word line signals WS21, WS22 and WS2K are embodiments of the word line signals WLS. In some embodiments, the word line driver 120 is further configured to generate the word line signals WS21, WS22 and WS2K.

In some embodiments, in response to the word line signal WS21 having an enable voltage level, the memory cell MC1 generates a cell current I21 passing through the nodes N21 and N22, and in response to the word line signal WS21 having a disable voltage level, the memory cell MC1 does not generate the cell current I21. Similarly, in response to the word line signal WS22 having the enable voltage level, the memory cell MC2 generates a cell current I22 passing through the nodes N21 and N22, and in response to the word line signal WS22 having a disable voltage level, the memory cell MC2 does not generate the cell current I21. In response to the word line signal WS2K having the enable voltage level, the memory cell MCK generates a cell current I2K passing through the nodes N21 and N22, and in response to the word line signal WS2K having a disable voltage level, the memory cell MCK does not generate the cell current I2K.

In some embodiments, the current source is configured to provide a current ICST from the node N21 passing through activated ones of the memory cells MC1-MCK to the node N22. For example, in response to the word line signals WS21 and WS2K having the enable voltage level and other word line signals, such as the word line signal WS22, have the disable voltage level, the memory cells MC1 and MCK are activated and other memory cells of the memory array 210, such as the memory cell MC2, are deactivated. Accordingly, the current ICST is divided into cell currents I21 and I2K passing through the memory cells MC1 and MCK. In some embodiments, the current ICST has a constant current value. In some embodiments, the current ICST is referred to as a total current flowing through the nodes N21 and N22.

In some embodiments, a voltage level of the voltage signal VMAC is equal to a current value of the current ICST times a resistance of the memory array 210, which is a parallel resistance of the active ones of the memory cells MC1-MCK. In some embodiments, the voltage level of the voltage signal VMAC is configured to indicate a data value of data stored in the memory array 210. Further details associated with the voltage level of the voltage signal VMAC are described below with embodiments shown in FIG. 3A to FIG. 3C.

In some embodiments, each of the memory cells MC1-MCK includes a switch and a resistor coupled in series. As illustratively shown in FIG. 2, the memory cells MC1-MCK includes switches T21-T2K and resistors R21-R2K. The memory cell MC1 includes a switch T21 and a resistor R21 coupled in series between the nodes N21 and N22. The memory cell MC2 includes a switch T22 and a resistor R22 coupled in series between the nodes N21 and N22. The memory cell MCK includes a switch T2K and a resistor R2K coupled in series between the nodes N21 and N22. A control terminal of the switch T21 is configured to receive the word line signal WS21, a control terminal of the switch T22 is configured to receive the word line signal WS22, and a control terminal of the switch T2K is configured to receive the word line signal WS2K.

In some embodiments, for the memory cells MC1-MCK being implemented as phase change random access memory, the resistors R21-R2K are implemented as chalcogenide, such as $Ge_2Sb_2Te_5$, $Ge_6Sb_1Te_2$, $Ge_4Sb_2Te_4$ and/or other kinds of $Ge_xSb_yTe_z$. In some embodiments, for the memory cells MC1-MCK being implemented as anion-type RRAM, the resistors R21-R2K are implemented as $WO_x$, $HfO_x$, $TaO_x$, and/or $AlO_x$. In some embodiments, for the memory cells MC1-MCK being implemented as Cation-type RRAM, the resistors R21-R2K are implemented as conductive bridge random access memory (CBRAM) $LiSiO_x$. In some embodiments, for the memory cells MC1-MCK being implemented as oxide-based electrode RRAM, the resistors R21-R2K are implemented as ITO, Gd:SiOx and/or TiN.

In some embodiments, a data value of data stored in each of the memory cells MC1-MCK is associated with a resistance of a resistor in the corresponding one of the memory cells MC1-MCK. For example, in response to a resistance of the resistor R21 being increased, a data value of the data DT21 is decreased. In response to a resistance of the resistor R22 being increased, a data value of the data DT22 is decreased. In response to a resistance of the resistor R2K being increased, a data value of the data DT2K is decreased. Further details associated with relationships between the resistance and the data value are described below with embodiments shown in FIG. 3A to FIG. 3C.

Figure 3A:
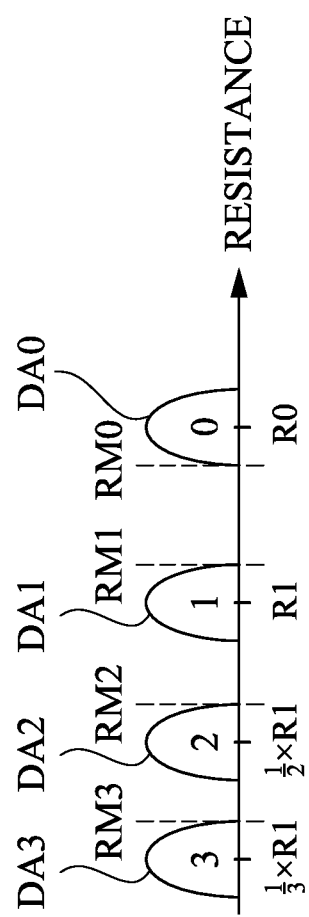
FIG. 3A is a schematic diagram of distribution curves of resistances of the memory cells shown in FIG. 2, in accordance with some embodiments of the present disclosure.

FIG. 3A is a schematic diagram 300A of distribution curves of resistances of the memory cells MC1-MCK shown in FIG. 2, in accordance with some embodiments of the present disclosure. As illustratively shown in FIG. 3A, the schematic diagram 300A includes a horizontal axis corresponding to the resistances indicating different data values.

As illustratively shown in FIG. 3A, the schematic diagram 300A further includes distribution curves DA0-DA3. The distribution curve DA0 corresponds to a memory cell (for example, one of the memory cells MC1-MCK shown in FIG. 2) with data value 0 and having a resistance being approximately a resistance R0. The distribution curve DA1 corresponds to a memory cell with data value 1 and having a resistance being approximately a resistance R1. In some embodiments, the resistance R0 is larger than ten times the resistance R1. The distribution curve DA2 corresponds to a memory cell with data value 2 and having a resistance being approximately an half of the resistance R1. The distribution curve DA3 corresponds to a memory cell with data value 3 and having a resistance being approximately one-third of the resistance R1.

For example, in response to the data DT21 stored in the memory cell MC1 having the data value 0, the resistor R21 has approximately the resistance R0. In response to the data DT21 having the data value 1, the resistor R21 has approximately the resistance R1. In response to the data DT21 having the data value 2, the resistor R21 has approximately an half of the resistance R1. In response to the data DT21 having the data value 3, the resistor R21 has approximately one-third of the resistance R1.

Similarly, in response to the data DT22 stored in the memory cell MC2 having the data value 0, the resistor R22 has approximately the resistance R0. In response to the data DT22 having the data value 1, the resistor R22 has approximately the resistance R1. In response to the data DT22 having the data value 2, the resistor R22 has approximately an half of the resistance R1. In response to the data DT22 having the data value 3, the resistor R22 has approximately one-third of the resistance R1. In response to the data DT2K stored in the memory cell MCK having the data value 0, the resistor R2K has approximately the resistance R0. In response to the data DT2K having the data value 1, the resistor R2K has approximately the resistance R1. In response to the data DT2K having the data value 2, the resistor R2K has approximately an half of the resistance R1. In response to the data DT2K having the data value 3, the resistor R2K has approximately one-third of the resistance R1.

In summary, for N being a positive integer, in response to data stored in one of the memory cells MC1-MCK having a data value N, the one of the memory cells MC1-MCK has a resistance being approximately one-Nth of the resistance R1. In some embodiments, in response to data stored in one of the memory cells MC1-MCK having a data value (N−M), the one of the memory cells MC1-MCK has a resistance being approximately one-(N−M)th of the resistance R1, for M being a positive integer smaller than N.

As illustratively shown in FIG. 3A, the schematic diagram 300A further includes threshold resistances RM0-RM3. The threshold resistances RM0-RM3 correspond to the data values 0-3, respectively. In some embodiments, the threshold resistances RM0-RM3 are approximately being the resistances R0, R1, (½)×R1 and (⅓)×R1, respectively. In some embodiments, a memory cell has a data value when the memory cell meets the requirement of a corresponding threshold resistance.

For example, when the memory cell MC1 has a resistance smaller than the threshold resistance RMQ, the memory cell MC1 has the data value Q, for Q being 1, 2 or 3. When the memory cell MC1 has a resistance larger than the threshold resistance RMQ, the memory cell MC1 does not have the data value Q.

For another example, when the memory cell MC1 has a resistance larger than the threshold resistance RM0, the memory cell MC1 has the data value 0. When the memory cell MC1 has a resistance smaller than the threshold resistance RM0, the memory cell MC1 does not have the data value 0.

Figure 3B:
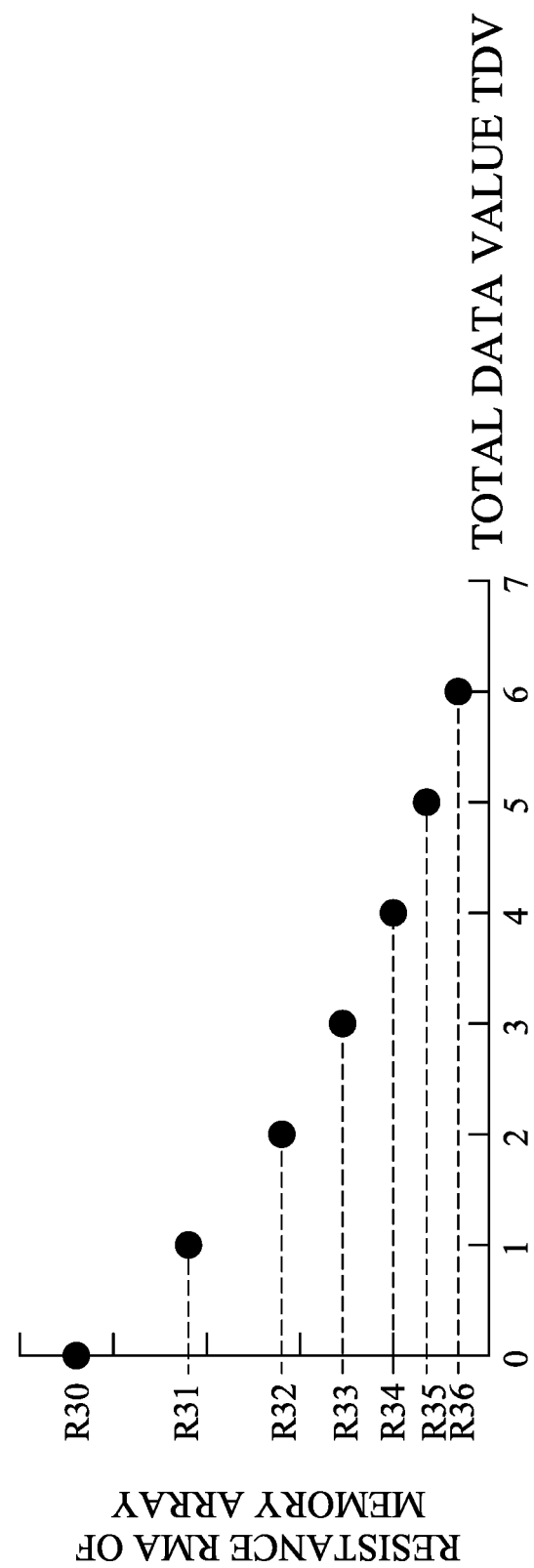
FIG. 3B is a schematic diagram of the voltage level of the voltage signal shown in FIG. 2, in accordance with some embodiments of the present disclosure.

FIG. 3B is a schematic diagram 300B of the voltage level of the voltage signal VMAC shown in FIG. 2, in accordance with some embodiments of the present disclosure. As illustratively shown in FIG. 3B, a diagram 300B includes a horizontal axis corresponding to a total data value TDV of data stored in the memory array 210 shown in FIG. 2, and a vertical axis corresponding to an equivalent resistance RMA of the memory array 210. In some embodiments, the total data value TDV is referred to as a multiply and accumulate (MAC) value of the memory array 210.

As illustratively shown in FIG. 3B, in response to the total data value TDV being a data value L, the equivalent resistance RMA is a resistance R3L, for L being a non-negative integer. For example, in response to the total data value TDV being 0, the equivalent resistance RMA is the resistance R30. In some embodiments, in response to the total data value TDV being increased, the equivalent resistance RMA is decreased. In other words, the resistance R3(L+1) is smaller than the resistance R3L.

For illustration of FIG. 3B with reference to FIG. 2, the equivalent resistance of the memory array 210 is the parallel resistance of the active ones of the memory cells MC1-MCK. In some embodiments, the voltage level of the voltage signal VMAC is proportional with the equivalent resistance RMA. In some embodiments, the voltage level of the voltage signal VMAC is equal to the resistance R3L times the current value of the current ICST.

In some embodiments, the total data value TDV is a summation value of the data values of activated ones of the memory cells MC1-MCK. For example, in response to the memory cells MC1 and MC2 being activated, the memory cells MC3-MCK being deactivated, the data DT21 having data value 0, and the data DT22 having data value 3, the total data value TDV is a summation value 3 of the data value 0 of the data DT21 and the data value 3 of the data DT22. In such example, the memory cell MC1 has the resistance R0 shown in FIG. 3A, and the memory cell MC2 has the resistance $(1/3) \times R1$ shown in FIG. 3A. Accordingly, the equivalent resistance RMA is a parallel resistance of the resistances R0 and $(1/3) \times R1$. In embodiments that the resistance R0 is larger than ten times of the resistance R1, the equivalent resistance RMA is approximately $(1/3) \times R1$. Accordingly, the resistance R33 is approximately $(1/3) \times R1$.

For another example, in response to the memory cells MC1 and MC2 being activated, the memory cells MC3-MCK being deactivated, the data DT21 having data value 1, and the data DT22 having data value 2, the total data value TDV is a summation value 3 of the data value 1 of the data DT21 and the data value 2 of the data DT22. In such example, the memory cell MC1 has the resistance R1 shown in FIG. 3A, and the memory cell MC2 has the resistance $(1/2) \times R1$ shown in FIG. 3A. Accordingly, the equivalent resistance RMA is a parallel resistance of the resistances R1 and $(1/2) \times R1$. In other words, the equivalent resistance RMA is also $(1/3) \times R1$.

For a further example, in response to the memory cells MC1, MC2 and MCK being activated, the memory cells MC3-MC(K−1) being deactivated, and each of the data DT21, DT22 and DT2K having data value 1, the total data value TDV is a summation value 3 of the data value 1 of the data DT21, the data value 1 of the data DT22 and the data value 1 of the data DT2K. In such example, each of the memory cells MC1, MC2 and MCK has the resistance R1. Accordingly, the equivalent resistance RMA is a parallel resistance of three of the resistances R1. In other words, the equivalent resistance RMA is also $(1/3) \times R1$.

In summary, in response to the total data value TDV being a positive integer N1, the equivalent resistance RMA is same for various combinations of data values of the activated ones of the memory cells MC1-MCK. For example, in a first case that the memory cell MC1 has data value N1, the memory cell MC2 has data value 0 and memory cells MC3-MCK are deactivated, the equivalent resistance RMA is R3N1. In a second case that the memory cell MC1 has data value (N1−M1), the memory cell MC2 has data value M1 and memory cells MC3-MCK are deactivated, the equivalent resistance RMA is also R3N1, for M1 being a positive integer smaller than N1. It is noted that each of the first case and the second case has the total data value TDV being N1, and the equivalent resistance RMA is same for the same total data value TDV. In various embodiments, in response to various numbers of the active ones of the memory cells MC1-MCK having various combinations of data values with the total data value TDV being N1, the equivalent resistance RMA are same. Accordingly, a voltage level of the voltage signal VMAC is same for various combinations of data values with the total data value TDV being N1.

In some approaches, when a memory array stores a total data value, a voltage signal corresponding to the total data value has various voltage levels in response to various combinations of respective data values of memory cells of the memory array. In other words, a problem of pattern variation of the total data value occurs.

Compared to the above approaches, in some embodiments of the present disclosure, resistances of the memory cells MC1-MCK having the data value N are configured to one-Nth of the resistance R1 corresponding to the data value 1. Accordingly, when the memory array 210 stores the total data value TDV, the voltage level of the voltage signal VMAC is same in response to various combinations of respective data values of memory cells MC1-MCK. As a result, the problem of pattern variation is reduced.

Figure 3C:
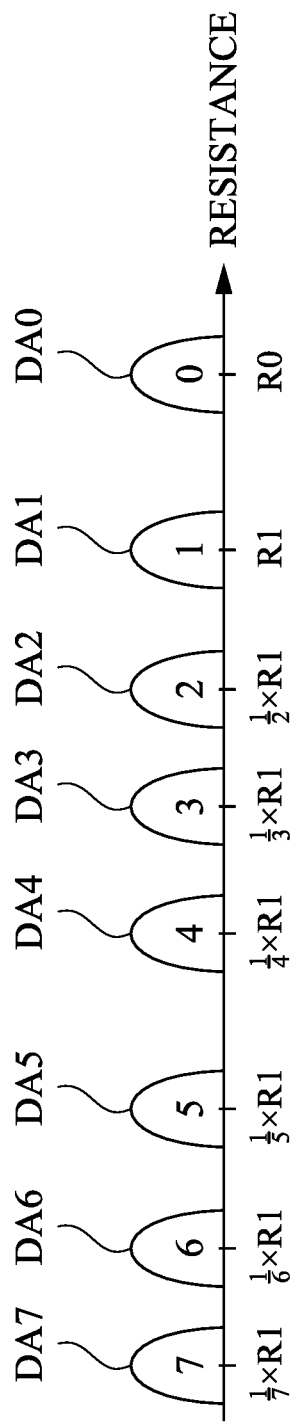
FIG. 3C is a schematic diagram of distribution curves of resistances of the memory cells shown in FIG. 2, in accordance with some embodiments of the present disclosure.

FIG. 3C is a schematic diagram 300C of distribution curves of resistances of the memory cells MC1-MCK shown in FIG. 2, in accordance with some embodiments of the present disclosure. As illustratively shown in FIG. 3C, the schematic diagram 300C includes a horizontal axis corresponding to the resistances indicating different data values.

For illustration of FIG. 3C with reference to FIG. 3A, the schematic diagram 300C is a further embodiment of the schematic diagram 300A. Comparing with the schematic diagram 300A, the schematic diagram 300C further includes distribution curves DA4-DA7.

In some embodiments, the distribution curve DA4 corresponds to a memory cell (for example, one of the memory cells MC1-MCK shown in FIG. 2) with data value 4 and having a resistance being approximately one-fourth of the resistance R1. The distribution curve DA5 corresponds to a memory cell with data value 5 and having a resistance being approximately one-fifth of the resistance R1. The distribution curve DA6 corresponds to a memory cell with data value 6 and having a resistance being approximately one-sixth of the resistance R1. The distribution curve DA7 corresponds to a memory cell with data value 7 and having a resistance being approximately one-seventh of the resistance R1.

FIG. 4A is a timing diagram 400A of a current pulse PA4 applied to the memory array 210 shown in FIG. 2, in accordance with some embodiments of the present disclosure. As illustratively shown in FIG. 4A, the timing diagram 400A includes periods P40-P49 arranged continuously in order.

For illustration of FIG. 4A with reference to FIG. 1 and FIG. 2, in some embodiments, the word line driver 120 is configured to generate the current pulse PA4, and apply the current pulse PA4 to the memory array, such as the memory array 160 and/or the memory array 210. In some embodiments, the current pulse PA4 applied to one or more of the memory cells MC1-MCK, to adjust the resistance of corresponding one or more of the resistors R21-R2K. For example, in response to the current pulse PA4 being applied to the memory cell MC1, the resistance of the resistor R21 is decreased.

As illustratively shown in FIG. 4A, the current pulse PA4 has current levels A41-A48 during the periods P41-P48, respectively. In some embodiments, the current levels A41-A48 decreased in order to form a tail shape as shown in FIG. 4A. In some embodiments, the resistances of the memory cells MC1-MCK are decreased when the resistors R21-R2K are programmed by one or more current pulse with such tail shape. In some embodiments, the current level A41 is the highest current level among the current levels A41-A48, and is referred to as a max current level of the current pulse PA4.

As illustratively shown in FIG. 4A, the current pulse PA4 has a current level A40 during the periods P40 and P49. In some embodiments, the current level A40 is a zero current level. In some embodiments, a time length of the period P41 is approximately 100 nanoseconds, and each of time length of the periods P42-P48 is approximately 10 nanoseconds. In some embodiments, the current levels A41-A48 are approximately 512, 448, 384, 320, 256, 192, 128 and 64 microamperes, respectively.

FIG. 4B is a timing diagram 400B of a current pulse PB4 applied to the memory array 210 shown in FIG. 2, in accordance with some embodiments of the present disclosure. As illustratively shown in FIG. 4B, the timing diagram 400B includes periods Q41-Q43 arranged continuously in order.

For illustration of FIG. 4B with reference to FIG. 1 and FIG. 2, in some embodiments, the word line driver 120 is configured to generate the current pulse PB4, and apply the current pulse PB4 to the memory array, such as the memory array 160 and/or the memory array 210. In some embodiments, the current pulse PB4 applied to one or more of the memory cells MC1-MCK, to adjust the resistance of corresponding one or more of the resistors R21-R2K. For example, in response to the current pulse PB4 being applied to the memory cell MC1, the resistance of the resistor R21 is increased.

As illustratively shown in FIG. 4B, the current pulse PB4 has a current level A410 during the period Q42, and has the current level A40 during the periods Q41 and Q43. For illustration of FIG. 4B with reference to FIG. 4A, the current pulse PB4 does not have a tail shape like the current pulse PA4. In some embodiments, the resistances of the memory cells MC1-MCK are increased when the resistors R21-R2K are programmed by one or more pulse without tail shape. In some embodiments, a time length of the period Q42 is approximately 100 nanoseconds, and the current level A410 is approximately 1024 microamperes.

Figure 5:
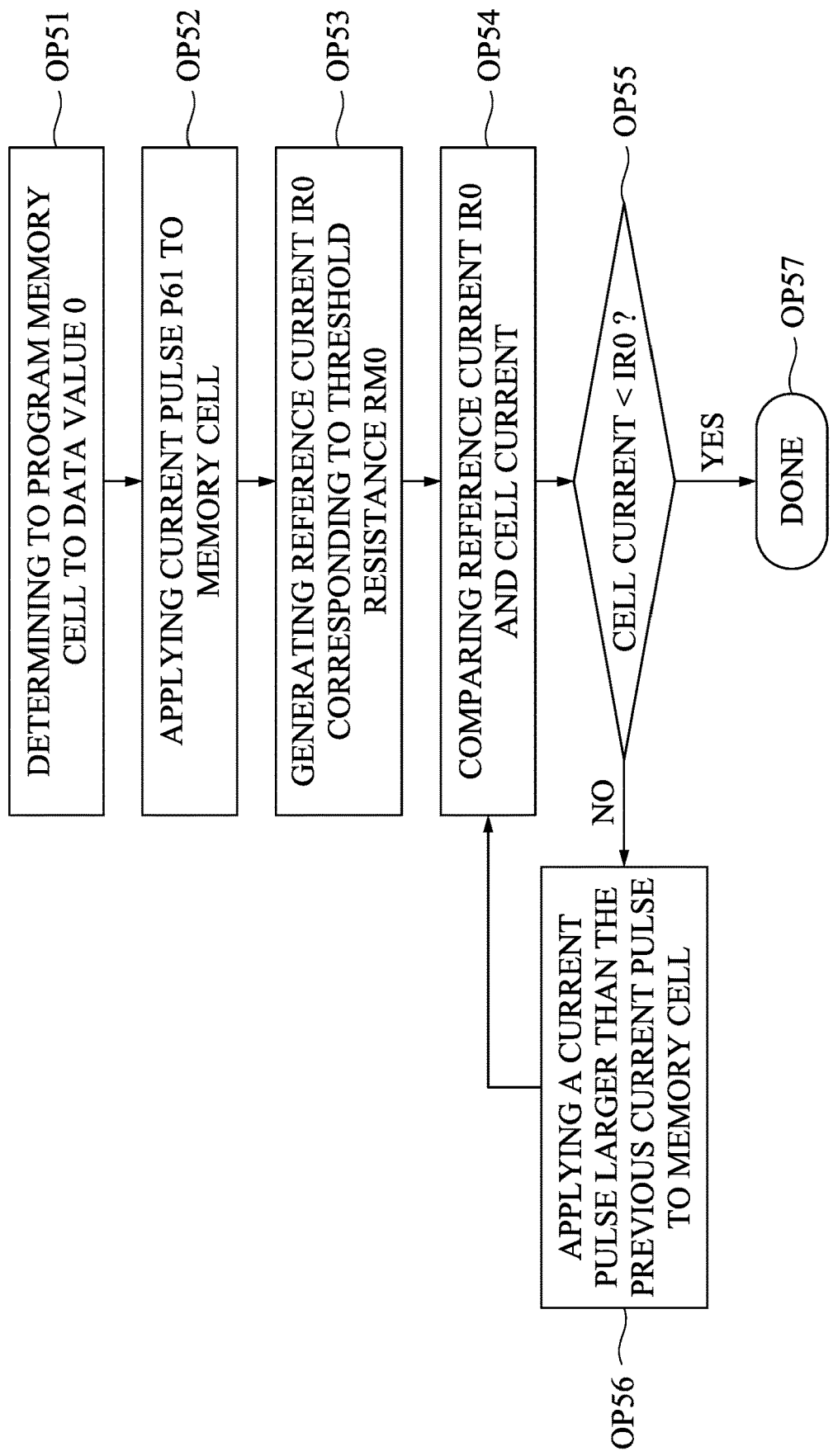
FIG. 5 is a flowchart diagram of a method for operating the memory devices shown in FIG. 1 and FIG. 2, in accordance with some embodiments of the present disclosure.

FIG. 5 is a flowchart diagram of a method 500 for operating the memory device 100 and/or the memory device 200 shown in FIG. 1 and FIG. 2, in accordance with some embodiments of the present disclosure. As illustratively shown in FIG. 5, the method 500 includes operations OP51-OP57.

At the operation OP51, a memory cell of the memory array 210, such as the memory cell MC1 shown in FIG. 2, is determined to be programmed to the data value 0. In various embodiments, the memory cell MC1 has various data values before the operation OP51.

Figure 6:
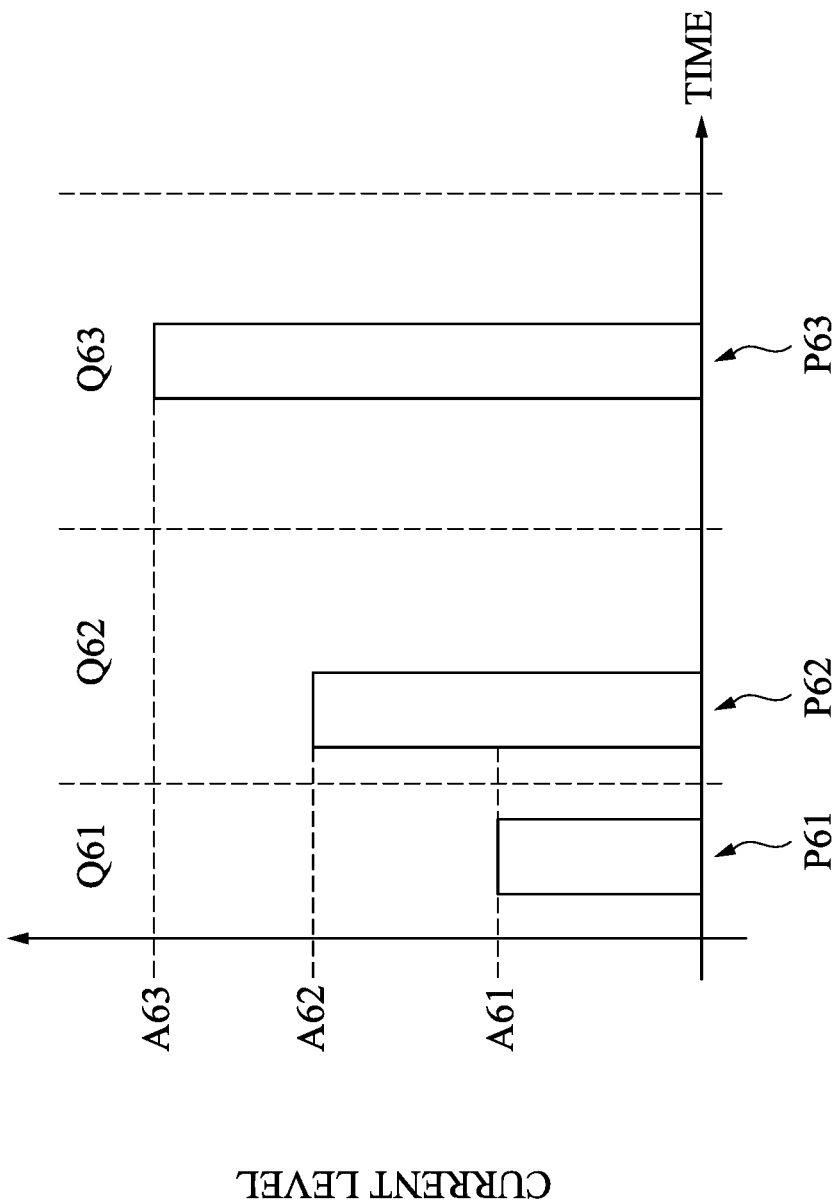
FIG. 6 is a timing diagram of current pulses applied based on the operations shown in FIG. 5, in accordance with some embodiments of the present disclosure.

At the operation OP52, a word line driver, such as the word line driver 120 shown in FIG. 1, is configured to generate a current pulse, such as the current pulse PB4 shown in FIG. 4B or a current pulse P61 shown in FIG. 6. At the operation OP52, the word line driver 120 is configured to apply the current pulse P61 to the memory cell MC1, to increase the resistance of the memory cell MC1.

At the operation OP53, a reference current generator, such as the reference current generator 180 shown in FIG. 1, is configured to generate a reference current IR0. In some embodiments, the reference current IR0 has a current level corresponding to the threshold resistance RM0 shown in FIG. 3A.

At the operation OP54, the memory cell MC1 configured to generate a cell current IC51, and a reading device, such as the reading device 150, is configured to compare the cell current IC51 and the reference current IR0. It is noted that the cell current IC51 is inverse proportional to the resistance of the memory cell MC1. In some embodiments, the resistance of the memory cell MC1 is smaller than the threshold resistance RM0 when the cell current IC51 is larger than the reference current IR0, and the resistance of the memory cell MC1 is larger than the threshold resistance RM0 when the cell current IC51 is smaller than the reference current IR0.

At the operation OP55, the reading device 150 is configured to generate a comparing result signal CRS0 based on the comparison of the cell current IC51 and the reference current IR0. In response to the cell current IC51 being smaller than the reference current IR0, the operation OP57 is performed. In response to the cell current IC51 being larger than or equal to the reference current IR0, the operation OP56 is performed. For illustration of FIG. 5 with reference to FIG. 1, the reference current IR0, the cell current IC51 and the comparing result signal CRS0 are embodiments of the reference current IR, the cell current IC1 and the comparing result signal CRS, respectively.

At the operation OP56, a current pulse (for example, a current pulse P62 shown in FIG. 6) larger than the current pulse P61 of the operation OP52 is applied to the memory cell MC1 according to the comparing result signal CRS0, to further increase the resistance of the memory cell MC1. After the operation OP56, the operation OP54 is performed again. Accordingly, the memory cell MC1 being programmed by the current pulse P62 is configured to generate a cell current IC52. Then, at the operation OP54 is performed again to compare the cell current IC52 and the reference current IR0.

As illustratively shown in FIG. 5, the operations OP54-OP56 form a loop to apply a current pulse larger than a current pulse of a previous loop to the memory cell MC1. The operations OP54-OP56 are performed to increase the resistance of the memory cell MC1 until the cell current generated from the memory cell MC1 being smaller than the reference current IR0.

At the operation OP57, in response to the cell current generated from the memory cell MC1 being smaller than the reference current IR0, the resistance of the memory cell MC1 is larger than the threshold resistance RM0. Accordingly, the memory cell MC1 has the data value 0 and the programming of the memory cell MC1 is done.

FIG. 6 is a timing diagram 600 of current pulses P61-P63 applied based on the operations OP52 and OP56 shown in FIG. 5, in accordance with some embodiments of the present disclosure. As illustratively shown in FIG. 6, the timing diagram 600 includes periods Q61-Q63 arranged continuously in order.

As illustratively shown in FIG. 6, the current pulse P61 has a current level A61 during the period Q61. The current pulse P62 has a current level A62 during the period Q62. The current pulse P63 has a current level A63 during the period Q63. In some embodiments the current levels A61-A63 are increased in order. In other words, the current pulse P63 is larger than the current pulse P62, and the current pulse P62 is larger than the current pulse P61. For illustration of FIG. 6 with reference to FIG. 4B, each of the current pulses P61-P63 is an embodiment of the current pulse PB4. Therefore, some descriptions are not repeated for brevity.

For illustration of FIG. 6 with reference to FIG. 5, in some embodiments, the current pulse P61 is applied to the memory cell MC1 at the operation OP52. The current pulse P62 is applied to the memory cell MC1 at the operation OP56 during a first loop of the operations OP54-OP56. The current pulse P63 is applied to the memory cell MC1 at the operation OP56 during a second loop, which is after the first loop, of the operations OP54-OP56. In some embodiments, the memory cell MC1 is configured to receive the current pulses P61-P63 when the current pulses P61-P63 are applied to the memory cell MC1.

In some embodiments, after the period P63, the timing diagram 600 further includes more current pulses (not shown) having current levels larger than the current level A63, for being applied to the memory cell MC1 during the loops of the operations OP54-OP56.

Figure 7:
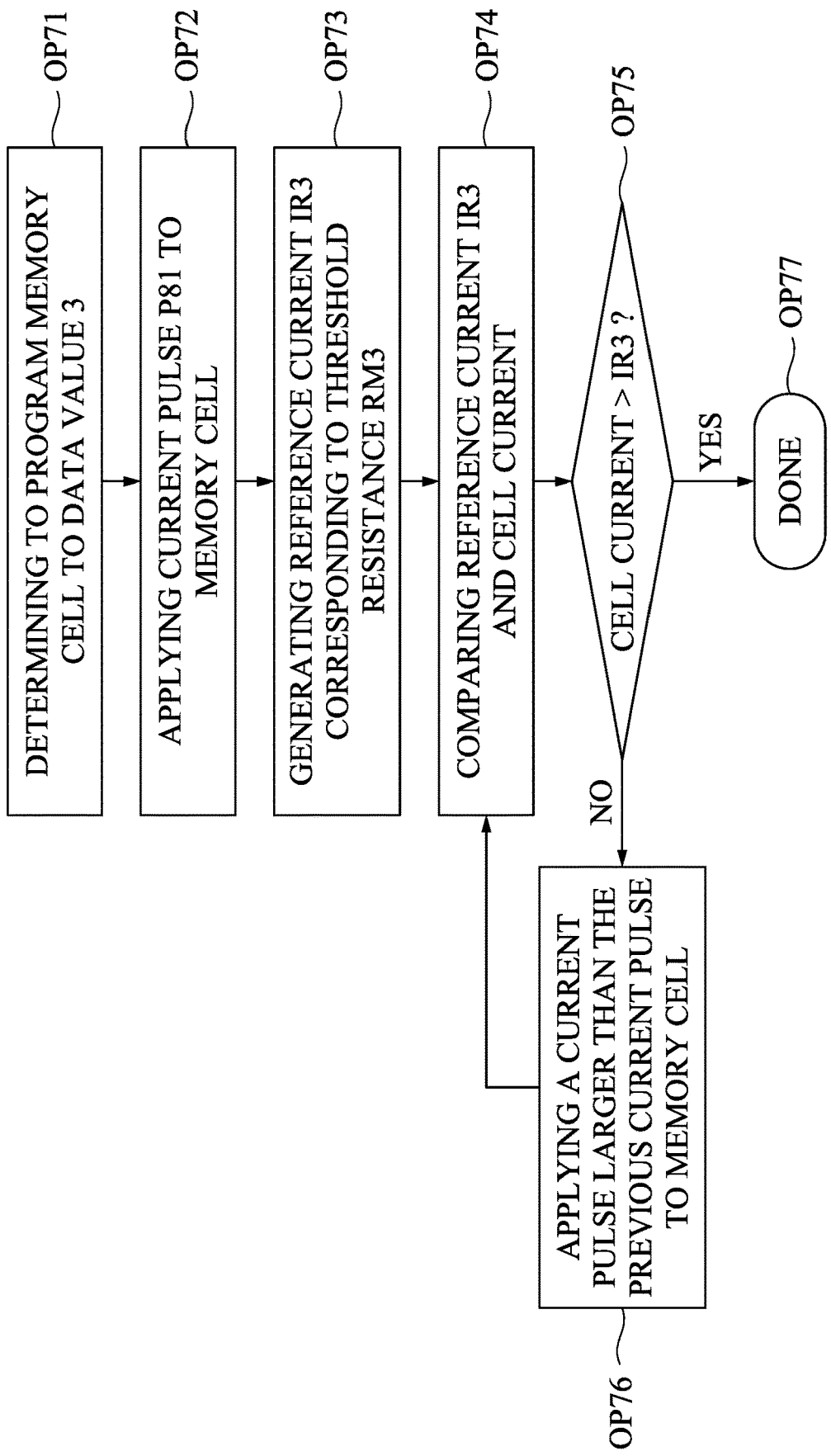
FIG. 7 is a flowchart diagram of a method for operating the memory devices shown in FIG. 1 and FIG. 2, in accordance with some embodiments of the present disclosure.

FIG. 7 is a flowchart diagram of a method 700 for operating the memory device 100 and/or the memory device 200 shown in FIG. 1 and FIG. 2, in accordance with some embodiments of the present disclosure. As illustratively shown in FIG. 7, the method 700 includes operations OP71-OP77.

At the operation OP71, a memory cell of the memory array 210, such as the memory cell MC1 shown in FIG. 2, is determined to be programmed to the data value 3. In some embodiments, the memory cell MC1 has the data value 0 before the operation OP71.

Figure 8:
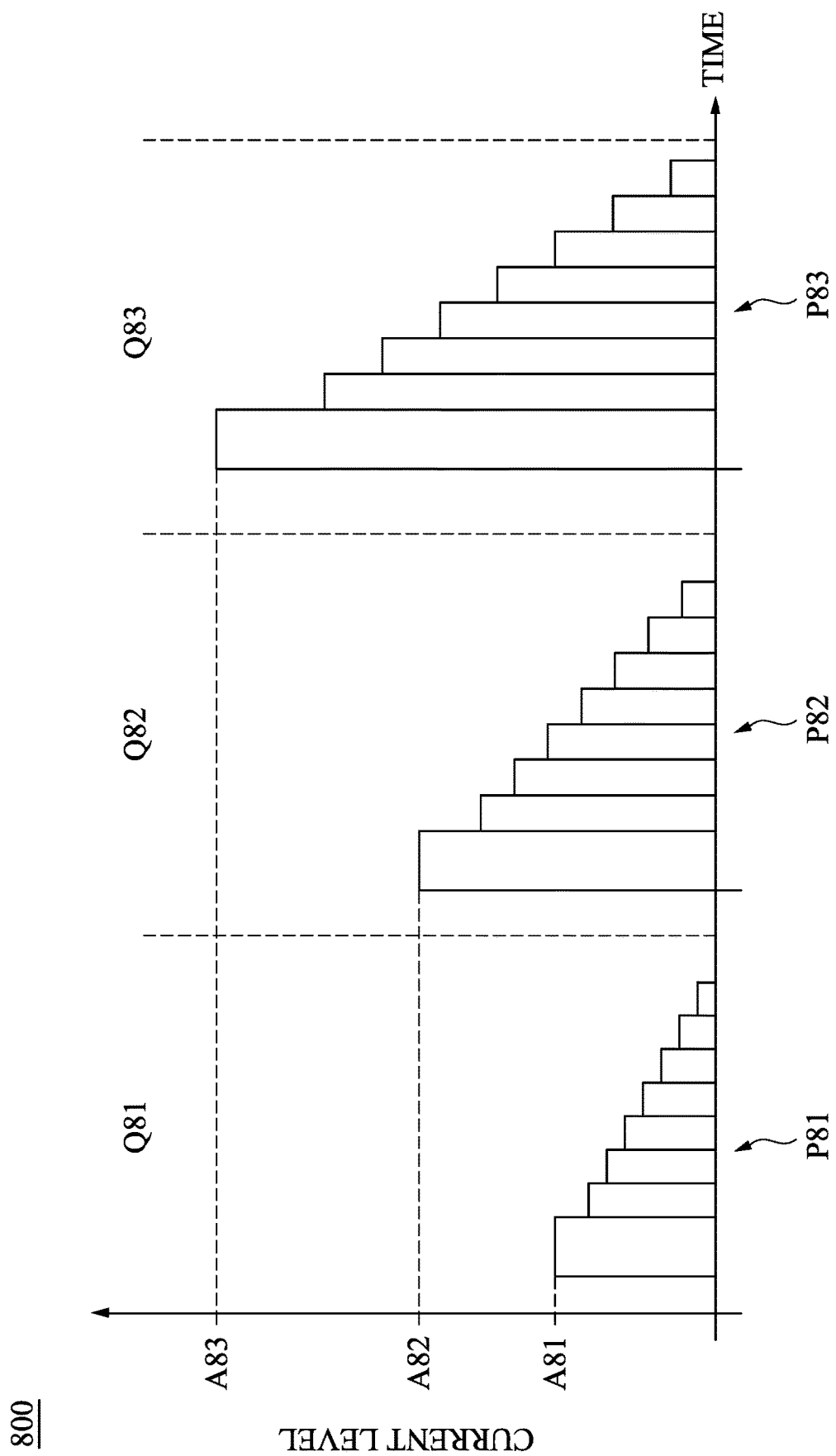
FIG. 8 is a timing diagram of current pulses applied based on the operations shown in FIG. 7, in accordance with some embodiments of the present disclosure.

At the operation OP72, a word line driver, such as the word line driver 120 shown in FIG. 1, is configured to generate a current pulse, such as the current pulse PA4 shown in FIG. 4A or a current pulse P81 shown in FIG. 8. At the operation OP72, the word line driver 120 is configured to apply the current pulse P81 to the memory cell MC1, to decrease the resistance of the memory cell MC1.

At the operation OP73, a reference current generator, such as the reference current generator 180 shown in FIG. 1, is configured to generate a reference current IR3. In some embodiments, the reference current IR3 has a current level corresponding to the threshold resistance RM3 shown in FIG. 3A.

At the operation OP74, the memory cell MC1 configured to generate a cell current IC71, and a reading device, such as the reading device 150, is configured to compare the cell current IC71 and the reference current IR3. It is noted that the cell current IC71 is inverse proportional to the resistance of the memory cell MC1. In some embodiments, the resistance of the memory cell MC1 is smaller than the threshold resistance RM3 when the cell current IC71 is larger than the reference current IR3, and the resistance of the memory cell MC1 is larger than the threshold resistance RM3 when the cell current IC71 is smaller than the reference current IR3.

At the operation OP75, the reading device 150 is configured to generate a comparing result signal CRS3 based on the comparison of the cell current IC71 and the reference current IR3. In response to the cell current IC71 being larger than the reference current IR3, the operation OP77 is performed. In response to the cell current IC71 being smaller than or equal to the reference current IR3, the operation OP76 is performed. For illustration of FIG. 5 with reference to FIG. 1, the reference current IR3, the cell current IC71 and the comparing result signal CRS3 are embodiments of the reference current IR, the cell current IC1 and the comparing result signal CRS, respectively.

At the operation OP76, a current pulse (for example, a current pulse P82 shown in FIG. 8) larger than the current pulse P81 of the operation OP72 is applied to the memory cell MC1, to further decrease the resistance of the memory cell MC1 according to the comparing result signal CRS3. After the operation OP76, the operation OP74 is performed again. Accordingly, the memory cell MC1 being programmed by the current pulse P82 is configured to generate a cell current IC72. Then, at the operation OP74 is performed again to compare the cell current IC72 and the reference current IR3.

As illustratively shown in FIG. 7, the operations OP74-OP76 form a loop to apply a current pulse larger than a current pulse of a previous loop to the memory cell MC1. The operations OP74-OP76 are performed to decrease the resistance of the memory cell MC1 until the cell current generated from the memory cell MC1 being larger than the reference current IR3.

At the operation OP77, in response to the cell current generated from the memory cell MC1 being larger than the reference current IR3, the resistance of the memory cell MC1 is smaller than the threshold resistance RM3. Accordingly, the memory cell MC1 has the data value 3 and the programming of the memory cell MC1 is done.

FIG. 8 is a timing diagram 800 of current pulses P81-P83 applied based on the operations OP72 and OP76 shown in FIG. 7, in accordance with some embodiments of the present disclosure. As illustratively shown in FIG. 8, the timing diagram 800 includes periods Q81-Q83 arranged continuously in order.

As illustratively shown in FIG. 8, the current pulse P81 has a max current level A81 during the period Q81. The current pulse P82 has a max current level A82 during the period Q82. The current pulse P83 has a max current level A83 during the period Q83. In some embodiments the current levels A81-A83 are increased in order. In other words, the current pulse P83 is larger than the current pulse P82, and the current pulse P82 is larger than the current pulse P81. For illustration of FIG. 8 with reference to FIG. 4A, each of the current pulses P81-P83 is an embodiment of the current pulse PA4. Therefore, some descriptions are not repeated for brevity.

For illustration of FIG. 8 with reference to FIG. 7, in some embodiments, the current pulse P81 is applied to the memory cell MC1 at the operation OP72. The current pulse P82 is applied to the memory cell MC1 at the operation OP76 during a first loop of the operations OP74-OP76. The current pulse P83 is applied to the memory cell MC1 at the operation OP76 during a second loop, which is after the first loop, of the operations OP74-OP76. In some embodiments, the memory cell MC1 is configured to receive the current pulses P81-P83 when the current pulses P81-P83 are applied to the memory cell MC1.

In some embodiments, after the period Q83, the timing diagram 800 further includes more current pulses (not shown) having current levels larger than the current level A83, for being applied to the memory cell MC1 during the loops of the operations OP74-OP76.

Figure 9:
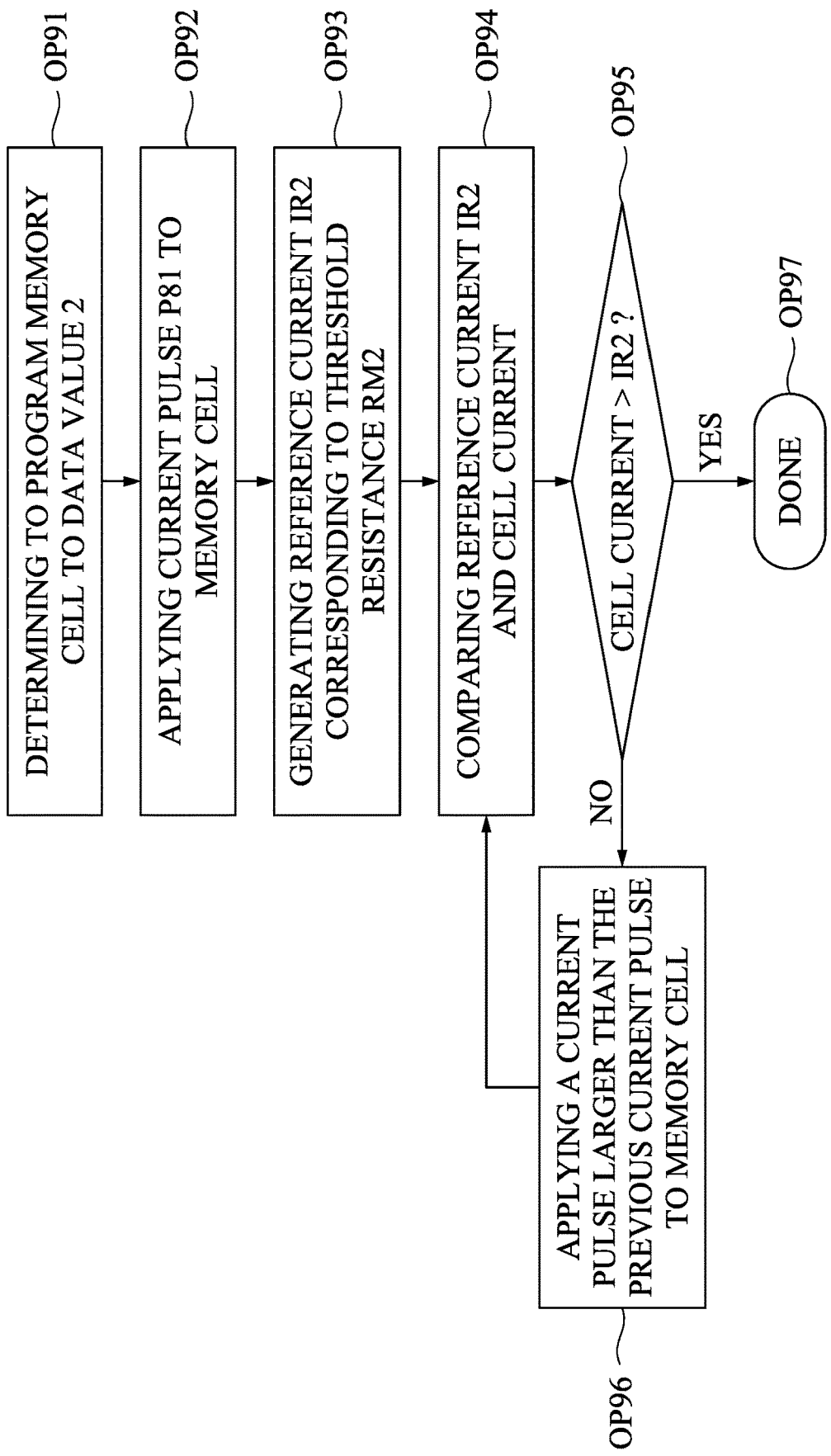
FIG. 9 is a flowchart diagram of a method for operating the memory devices shown in FIG. 1 and FIG. 2, in accordance with some embodiments of the present disclosure.

FIG. 9 is a flowchart diagram of a method 900 for operating the memory device 100 and/or the memory device 200 shown in FIG. 1 and FIG. 2, in accordance with some embodiments of the present disclosure. As illustratively shown in FIG. 9, the method 900 includes operations OP91-OP97.

At the operation OP91, a memory cell of the memory array 210, such as the memory cell MC1 shown in FIG. 2, is determined to be programmed to the data value 2. In some embodiments, the memory cell MC1 has the data value 0 before the operation OP91.

At the operation OP92, a word line driver, such as the word line driver 120 shown in FIG. 1, is configured to generate a current pulse, such as the current pulse PA4 shown in FIG. 4A or a current pulse P81 shown in FIG. 8. At the operation OP92, the word line driver 120 is configured to apply the current pulse P81 to the memory cell MC1, to decrease the resistance of the memory cell MC1.

At the operation OP93, a reference current generator, such as the reference current generator 180 shown in FIG. 1, is configured to generate a reference current IR2. In some embodiments, the reference current IR2 has a current level corresponding to the threshold resistance RM2 shown in FIG. 3A.

At the operation OP94, the memory cell MC1 configured to generate a cell current IC91, and a reading device, such as the reading device 150, is configured to compare the cell current IC91 and the reference current IR2. It is noted that the cell current IC91 is inverse proportional to the resistance of the memory cell MC1. In some embodiments, the resistance of the memory cell MC1 is smaller than the threshold resistance RM2 when the cell current IC91 is larger than the reference current IR2, and the resistance of the memory cell MC1 is larger than the threshold resistance RM2 when the cell current IC91 is smaller than the reference current IR2.

At the operation OP95, the reading device 150 is configured to generate a comparing result signal CRS2 based on the comparison of the cell current IC91 and the reference current IR2. In response to the cell current IC91 being larger than the reference current IR5, the operation OP97 is performed. In response to the cell current IC91 being smaller than or equal to the reference current IR2, the operation OP96 is performed. For illustration of FIG. 5 with reference to FIG. 1, the reference current IR2, the cell current IC91 and the comparing result signal CRS2 are embodiments of the reference current IR, the cell current IC1 and the comparing result signal CRS, respectively.

At the operation OP96, a current pulse (for example, a current pulse P82 shown in FIG. 8) larger than the current pulse P81 of the operation OP92 is applied to the memory cell MC1 according to the comparing result signal CRS2, to further decrease the resistance of the memory cell MC1. After the operation OP96, the operation OP94 is performed again. Accordingly, the memory cell MC1 being programmed by the current pulse P82 is configured to generate a cell current IC92. Then, at the operation OP94 is performed again to compare the cell current IC92 and the reference current IR2.

As illustratively shown in FIG. 9, the operations OP94-OP96 form a loop to apply a current pulse larger than a current pulse of a previous loop to the memory cell MC1. The operations OP94-OP96 are performed to decrease the resistance of the memory cell MC1 until the cell current generated from the memory cell MC1 being larger than the reference current IR2.

At the operation OP97, in response to the cell current generated from the memory cell MC1 being larger than the reference current IR2, the resistance of the memory cell MC1 is smaller than the threshold resistance RM2. Accordingly, the memory cell MC1 has the data value 2 and the programming of the memory cell MC1 is done.

Figure 10:
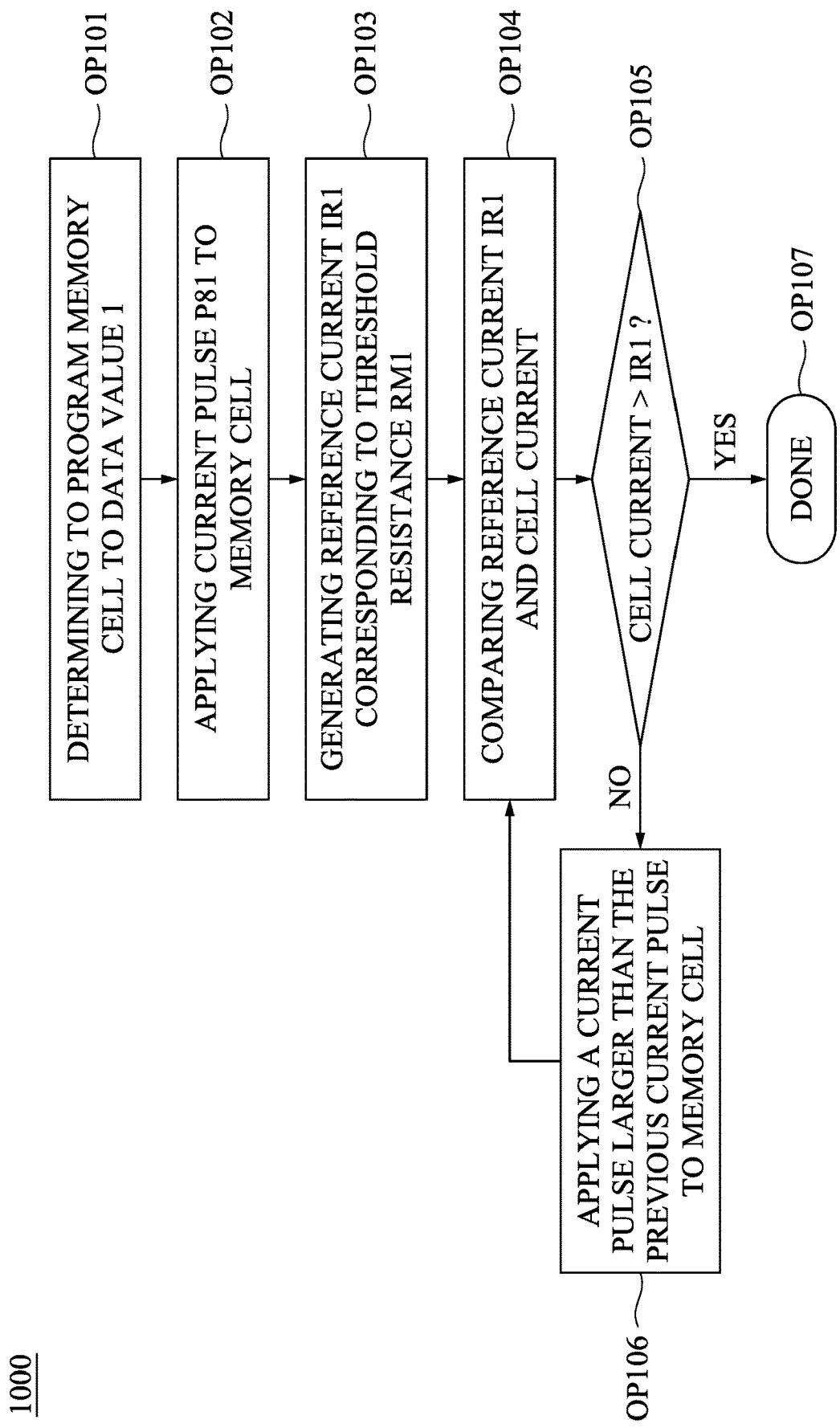
FIG. 10 is a flowchart diagram of a method for operating the memory devices shown in FIG. 1 and FIG. 2, in accordance with some embodiments of the present disclosure.

FIG. 10 is a flowchart diagram of a method 1000 for operating the memory device 100 and/or the memory device 200 shown in FIG. 1 and FIG. 2, in accordance with some embodiments of the present disclosure. As illustratively shown in FIG. 10, the method 1000 includes operations OP101-OP107.

At the operation OP101, a memory cell of the memory array 210, such as the memory cell MC1 shown in FIG. 2, is determined to be programmed to the data value 1. In some embodiments, the memory cell MC1 has the data value 0 before the operation OP101.

At the operation OP102, a word line driver, such as the word line driver 120 shown in FIG. 1, is configured to generate a current pulse, such as the current pulse PA4 shown in FIG. 4A or a current pulse P81 shown in FIG. 8. At the operation OP102, the word line driver 120 is configured to apply the current pulse P81 to the memory cell MC1, to decrease the resistance of the memory cell MC1.

At the operation OP103, a reference current generator, such as the reference current generator 180 shown in FIG. 1, is configured to generate a reference current IR1. In some embodiments, the reference current IR1 has a current level corresponding to the threshold resistance RM1 shown in FIG. 3A.

At the operation OP104, the memory cell MC1 configured to generate a cell current IC101, and a reading device, such as the reading device 150, is configured to compare the cell current IC101 and the reference current IR1. It is noted that the cell current IC101 is inverse proportional to the resistance of the memory cell MC1. In some embodiments, the resistance of the memory cell MC1 is smaller than the threshold resistance RM1 when the cell current IC101 is larger than the reference current IR1, and the resistance of the memory cell MC1 is larger than the threshold resistance RM1 when the cell current IC101 is smaller than the reference current IR1.

At the operation OP105, the reading device 150 is configured to generate a comparing result signal CRS1 based on the comparison of the cell current IC101 and the reference current IR1. In response to the cell current IC101 being larger than the reference current IR1, the operation OP107 is performed. In response to the cell current IC101 being smaller than or equal to the reference current IR1, the operation OP106 is performed. For illustration of FIG. 5 with reference to FIG. 1, the reference current IR1, the cell current IC101 and the comparing result signal CRS1 are embodiments of the reference current IR, the cell current IC1 and the comparing result signal CRS, respectively.

At the operation OP106, a current pulse (for example, a current pulse P82 shown in FIG. 8) larger than the current pulse P81 of the operation OP102 is applied to the memory cell MC1 according to the comparing result signal CRS1, to further decrease the resistance of the memory cell MC1. After the operation OP106, the operation OP104 is performed again. Accordingly, the memory cell MC1 being programmed by the current pulse P82 is configured to generate a cell current IC102. Then, at the operation OP104 is performed again to compare the cell current IC102 and the reference current IR1.

As illustratively shown in FIG. 10, the operations OP104-OP106 form a loop to apply a current pulse larger than a current pulse of a previous loop to the memory cell MC1. The operations OP104-OP106 are performed to decrease the resistance of the memory cell MC1 until the cell current generated from the memory cell MC1 being larger than the reference current IR1.

At the operation OP107, in response to the cell current generated from the memory cell MC1 being larger than the reference current IR1, the resistance of the memory cell MC1 is smaller than the threshold resistance RM1. Accordingly, the memory cell MC1 has the data value 1 and the programming of the memory cell MC1 is done.

Referring to FIG. 3A and FIG. 5 to FIG. 10, the reference currents IR0-IR3 correspond to the threshold resistance RM0-RM3, respectively. As described above, a current level of a reference current is inverse proportional to the corresponding threshold resistance in some embodiments. In such embodiments, the current level of the reference current IR3 is approximately three times of the current level of the reference current IR1, the current level of the reference current IR2 is approximately twice of the current level of the reference current IR1, and the current level of the reference current IR0 is smaller the current level of the reference current IR1. In some embodiments, a reference current for programming a memory cell to a data value N has a current level being N times of the current level of the reference current IR1.

Also disclosed is a memory device. The memory device includes a current source and a memory array. The current source is configured to provide a current to a first node. The memory array is coupled to the current source at the first node. The memory array includes memory cells. First terminals of the memory cells are coupled to the first node. Each of the memory cells has a first resistance in response to having a first data value, and has a second resistance in response to having a second data value. The second data value is N times the first data value. The second resistance is approximately one-Nth of the first resistance, for N being a positive integer larger than one.

Also disclosed is a memory device. The memory device includes a first memory cell and a second memory cell. The first memory cell is configured to store first data. The second memory cell is configured to store second data, a first terminal of the second memory cell being coupled to the first terminal of the first memory cell at a first node, a second terminal of the second memory cell being coupled to a second terminal of the first memory cell. In response to the first data having a first data value, the first memory cell has a first resistance. In response to the first data having a second data value which is N times of the first data value, the first memory cell has a second resistance which is approximately one-Nth of the first resistance, for N being a positive integer larger than one. In response to the second data having the first data value, the second memory cell has the first resistance. In response to the second data having the second data value, the second memory cell has the second resistance.

Also disclosed is a method of operating a memory device. The method includes: storing a first data in a first memory cell coupled between a first node and a second node; and generating a total current flowing through the first node and the second node to generate a voltage signal at the first node. Generating the total current includes: generating, by the first memory cell, a first current having a first current value in response to the first data having a first data value; and generating, by the first memory cell, the first current having a second current value which is approximately N times the first current value in response to the first data having a second data value which is N times the first data value, for N being a positive integer larger than one.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a current source configured to provide a current to a first node; and
    a memory array coupled to the current source at the first node, the memory array comprising:
        a plurality of memory cells, first terminals of the plurality of memory cells being coupled to the first node,
        wherein each of the plurality of memory cells has a first resistance in response to having a first data value, and has a second resistance in response to having a second data value,
    the second data value is N times the first data value, and
    the second resistance is approximately one-Nth of the first resistance, for N being a positive integer larger than one.

2. The memory device of claim 1, wherein the plurality of memory cells comprises:
    a first memory cell, a first terminal of the first memory cell being coupled to the first node,
    wherein in response to the first memory cell having the second data value, the first memory cell has the second resistance, and
    in response to the first memory cell having a third data value which is (N−M) times of the first data value, the first memory cell has a third resistance which is approximately an one-(N−M)th of the first resistance, for M being a positive integer smaller than N.

3. The memory device of claim 2, wherein the plurality of memory cells further comprises:
    a second memory cell, a first terminal of the second memory cell being coupled to the first node, a second terminal of the second memory cell being coupled to a second terminal of the first memory cell,
    in response to the second memory cell having the first data value, the second memory cell has the first resistance, and
    in response to the second memory cell having the third data value, the second memory cell has the third resistance.

4. The memory device of claim 2, wherein in response to the first memory cell having a fourth data value which is (N−M−1) times of the first data value, the first memory cell has a fourth resistance which is approximately an one-(N−M−1)th of the first resistance, for M being larger than 1.

5. The memory device of claim 1, wherein
    the memory array is configured to generate a voltage signal having a voltage level in response to a first memory cell of the memory array having the second data value, and
    the memory array is further configured to generate the voltage signal having the voltage level in response to the first memory cell having a third data value which is M times of the first data value and a second memory cell of the memory array having a fourth data value which is (N−M) times of the first data value, for M being a positive integer smaller than N.

6. The memory device of claim 1, further comprising:
    a reference current generator;
    a reading circuit coupled to the reference current generator, and configured to compare a reference current and a cell current generated by a first memory cell of the memory array to generate a comparing result signal; and
    a word line driver coupled to the reading circuit and the memory array, and configured to adjust a resistance of the first memory cell according to the comparing result signal.

7. The memory device of claim 6, wherein
    in response to the reference current corresponding to the first resistance and the cell current being smaller than the reference current, the word line driver is further configured to apply a first current pulse to the first memory cell to decrease the resistance of the first memory cell.

8. The memory device of claim 7, wherein
after the first current pulse is applied to the first memory cell, in response to the cell current being smaller than the reference current, the word line driver is further configured to apply a second current pulse to the first memory cell to further decrease the resistance of the first memory cell, and
a current level of the second current pulse is larger than a current level of the first current pulse.

9. The memory device of claim 6, wherein
in response to the reference current corresponding to a third data value being zero and the cell current being larger than the reference current, the word line driver is further configured to apply a first current pulse to the first memory cell to increase the resistance of the first memory cell.

10. The memory device of claim 7, wherein
after the first current pulse is applied to the first memory cell, in response to the cell current being larger than the reference current, the word line driver is further configured to apply a second current pulse to the first memory cell to further increase the resistance of the first memory cell, and
a current level of the second current pulse is larger than a current level of the first current pulse.

11. A memory device, comprising:
a first memory cell configured to store first data; and
a second memory cell configured to store second data, a first terminal of the second memory cell being coupled to a first terminal of the first memory cell at a first node, a second terminal of the second memory cell being coupled to a second terminal of the first memory cell,
wherein in response to the first data having a first data value, the first memory cell has a first resistance,
in response to the first data having a second data value which is N times of the first data value, the first memory cell has a second resistance which is approximately one-Nth of the first resistance, for N being a positive integer larger than one,
in response to the second data having the first data value, the second memory cell has the first resistance, and
in response to the second data having the second data value, the second memory cell has the second resistance.

12. The memory device of claim 11, wherein in response to one of the first data or the second data having a third data value which is (N−M) times of the first data value, a corresponding one of the first memory cell or the second memory cell has a third resistance which is approximately an one-(N−M)th of the first resistance, for M being a positive integer smaller than N.

13. The memory device of claim 12, wherein
in response to the first data having the third data value and the second data having a fourth data value which is M times of the first data value, the first node has a first voltage level, and
in response to the first data having the second data value and the second data having a fifth data value being zero, the first node has the first voltage level.

14. The memory device of claim 11, wherein the first memory cell is further configured to generate a cell current, and
in response to the first memory cell being programmed to the second data value and the cell current being smaller than a reference current corresponding to the second resistance, the first memory cell is further configured to receive a first current pulse for decreasing a resistance of the first memory cell to the second resistance.

15. The memory device of claim 14, wherein
after the first memory cell receives the first current pulse, in response to the first memory cell being programmed to the second data value and the cell current being smaller than the reference current, the first memory cell is further configured to receive a second current pulse, and
a current level of the second current pulse is larger than a current level of the first current pulse.

16. A method of operating a memory device, comprising:
storing a first data in a first memory cell coupled between a first node and a second node; and
generating a total current flowing through the first node and the second node to generate a voltage signal at the first node;
wherein generating the total current comprises:
generating, by the first memory cell, a first current having a first current value in response to the first data having a first data value; and
generating, by the first memory cell, the first current having a second current value which is approximately N times the first current value in response to the first data having a second data value which is N times the first data value, for N being a positive integer larger than one.

17. The method of claim 16, further comprising:
programming the first memory cell to the first data value, comprising:
applying a first current pulse to the first memory cell;
after the first current pulse being applied to the first memory cell, generating a first cell current by the first memory cell;
comparing the first cell current with a first reference current; and
in response to the first cell current being smaller than the first reference current, applying a second current pulse larger than the first current pulse to the first memory cell.

18. The method of claim 17, wherein programming the first memory cell to the first data value further comprises:
after the second current pulse being applied to the first memory cell, generating a second cell current by the first memory cell;
comparing the second cell current with the first reference current; and
in response to the second cell current being smaller than the first reference current, applying a third current pulse larger than the second current pulse to the first memory cell.

19. The method of claim 17, further comprising:
programming the first memory cell to the second data value, comprising:
applying a third current pulse to the first memory cell;
after the third current pulse being applied to the first memory cell, generating a second cell current by the first memory cell; and
comparing the second cell current with a second reference current approximately N times of the first reference current.

20. The method of claim 17, further comprising:
programming the first memory cell to a third data value being zero, comprising:
applying a third current pulse to the first memory cell;

after the third current pulse being applied to the first memory cell, generating a second cell current by the first memory cell; and comparing the second cell current with a second reference current smaller than the first reference current.

* * * * *